United States Patent
Morrison et al.

(10) Patent No.: US 9,531,384 B1
(45) Date of Patent: Dec. 27, 2016

(54) ADIABATIC DYNAMIC DIFFERENTIAL LOGIC FOR DIFFERENTIAL POWER ANALYSIS RESISTANT SECURE INTEGRATED CIRCUITS

(71) Applicants: Matthew Morrison, Oxford, MS (US); Jarred Adam Ligatti, Tampa, FL (US); Nagarajan Ranganathan, Tampa, FL (US)

(72) Inventors: Matthew Morrison, Oxford, MS (US); Jarred Adam Ligatti, Tampa, FL (US); Nagarajan Ranganathan, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 14/955,898

(22) Filed: Dec. 1, 2015

Related U.S. Application Data (60) Provisional application No. 62/085,941, filed on Dec. 1, 2014.

(51) Int. Cl.
*H03K 19/00* (2006.01)
*H03K 19/003* (2006.01)

(52) U.S. Cl.
CPC .... *H03K 19/0019* (2013.01); *H03K 19/00315* (2013.01)

(58) Field of Classification Search
None
See application file for complete search history.

(56) References Cited

U.S. PATENT DOCUMENTS

| | | | |
|---|---|---|---|
| 7,323,910 B2 | 1/2008 | Kunemund et al. | |
| 7,898,297 B2 | 3/2011 | Kapoor et al. | |
| 7,902,861 B2 | 3/2011 | Coenen | |
| 2005/0027998 A1* | 2/2005 | Teglia | H04L 9/003 713/193 |
| 2005/0270061 A1 | 12/2005 | Otterstedt | |
| 2006/0159257 A1* | 7/2006 | Fischer | H04L 9/003 380/28 |
| 2007/0116270 A1* | 5/2007 | Fischer | G06F 7/722 380/30 |

(Continued)

OTHER PUBLICATIONS

Agrawal et al., "The EM side—Channel(s)," . London, U.K.: Springer-Verlag, 2003, pp. 29-45.

(Continued)

*Primary Examiner* — Crystal L Hammond
(74) *Attorney, Agent, or Firm* — Molly L. Sauter; Smith & Hopen, P.A.

(57) ABSTRACT

An adiabatic dynamic differential logic circuit is provided for mitigating a differential power analysis (DPA) attack on a secure integrated chip including a plurality of transistors configured to perform each of a plurality of two-input logical output calculations, wherein each of the two-input logical output calculations results in a minimal differential power of the logic circuit. In one embodiment, a high-performance adiabatic dynamic differential logic circuit is provided which is optimized for very high operating frequencies. In another embodiment, a body-biased adiabatic dynamic differential logic circuit is provided which utilizes transistor body biasing to improve the switching time and differential power of the design.

20 Claims, 9 Drawing Sheets

(56) References Cited

U.S. PATENT DOCUMENTS

| | | | | |
|---|---|---|---|---|
| 2007/0143384 | A1* | 6/2007 | Muranaka | G06F 7/588 708/250 |
| 2007/0188355 | A1* | 8/2007 | Baek | H04L 9/003 341/51 |
| 2007/0286413 | A1* | 12/2007 | Derouet | H04L 9/004 380/28 |
| 2008/0065714 | A1* | 3/2008 | Fishcher | G06F 7/722 708/620 |
| 2009/0112896 | A1* | 4/2009 | Golic | G06F 7/764 |
| 2010/0301873 | A1* | 12/2010 | Nobukata | G06F 21/75 324/537 |
| 2011/0252244 | A1* | 10/2011 | Lesea | G06F 21/558 713/192 |
| 2012/0045061 | A1* | 2/2012 | Danger | H04L 9/003 380/277 |
| 2012/0200313 | A1* | 8/2012 | Kyue | H03K 19/0019 326/8 |
| 2012/0250854 | A1* | 10/2012 | Danger | H04L 9/003 380/28 |
| 2015/0381351 | A1* | 12/2015 | Kuenemund | H04L 9/0618 713/189 |

OTHER PUBLICATIONS

Athas et al., "A framework for practical low-power digital CMOS systems using adiabatic-switching principles," in Proc. Int. Workshop Low Power Design, Napa Valley, CA, USA, 1994, pp. 189-194.
Athas et al., "Reversible logic issues in adiabatic CMOS," in Proc. Workshop Phys. Comput., Nov. 1994, pp. 111-118.
Attoh-Okine et al., "Security issues of emerging smart cards fare collection application in mass transit," in Proc. Veh. Navigat. Inf. Syst. Conf., Jul./Aug. 1995, pp. 523-526.
Bennett, "Logical reversibility of computation," IBM J. Res. Develop., vol. 17, No. 6, pp. 525-532, 1973.
Chari et al., "Towards sound approaches to counteract power-analysis attacks," in Proc. 19th Annu. Int. Cryptol. Conf., vol. 1666, Aug. 1999, pp. 398-412.
Clavier et al., "Differential power analysis in the presence of hardware countermeasures," in Cryptographic Hardware and Embedded Systems. London, U.K.: Springer-Verlag, Aug. 2000, pp. 252-263.
Daemen et al., "Bitslice ciphers and power analysis attacks," in Proc. 7th Int. Fast Softw. Encryption Workshop, Apr. 2000, pp. 134-149.
De et al., "A dynamic energy recycling logic family for ultra-low-power gigascale integration (GSI)," in Proc. Int. Symp. Low Power Electron. Design, Aug. 1996, pp. 371-375.
Dickinson et al., "Adiabatic dynamic logic," IEEE J. Solid-State Circuits, vol. 30, No. 3, pp. 311-315, Mar. 1995.
Ezaki et al., "A power supply circuit recycling charge in adiabatic dynamic CMOS logic circuits," in Proc. IEEE Int. Conf. Field-Program. Technol., Jan. 2004., pp. 306-311.
Feynman, "Quantum mechanical computers," Found. Phys., vol. 16, No. 6, pp. 507-531, Jun. 1986.
Frank, "Common mistakes in adiabatic logic design and how to avoid them," in Proc. Embedded Syst. Appl., 2003, pp. 216-222.
Hashizume et al., "Power supply circuit for high speed operation of adiabatic dynamic CMOS logic circuits," in Proc. 1st IEEE Int. Workshop Electron. Design, Test Appl., Jan. 2002, pp. 459-461.
Hisakado et al., "Logically reversible arith-metic circuit using pass-transistor," in Proc. ISCAS, vol. 2. May 2004, pp. 853-856.
Khatir et al., Secure Adiabatic Logic: a Low-Energy DPA-Resistant Logic Style. Department of Computer Engineering, Sharif University of Technology, Tehran, Iran, 2008, pp. 1-11.
Khatir et al., "A body biasing method for charge recovery circuits: Improving the energy efficiency and DPA-immunity," in Proc. IEEE Comput. Soc. Annu. Symp. VLSI (ISVLSI), Jul. 2010, pp. 195-200.

Kocher, "Differential power analysis," Advances in Cryptology (Lecture Notes in Computer Science), vol. 1666. Berlin, Germany: Springer-Verlag, 1999, pp. 388-397.
Kocher, "Timing attacks on implementations of Diffie-Hellman, RSA, DSS, and other systems," in Advances in Cryptology. London, U.K.: Springer-Verlag, Aug. 1996, pp. 104-113.
Li et al., "A novel charge recovery logic structure with complementary pass-transistor network," in Proc. Int. SoC Design Cont (ISOCC), Nov. 2012, pp. 17-20.
Lo et al., An Adiabatic Differential Logic for Low-Power Digital Systems. IEEE Transactions on Circuits and Systems—II: Analog and Digital Signal Processing, vol. 46, No. 9, Sep. 1999, pp. 1245-1250.
Merkle, "Towards practical reversible logic," in Proc. Workshop Phys. Comput., Oct. 1992, pp. 227-228.
Messerges, "Using second-order power analysis to attack DPA resistant software," in Proc. CHES, vol. 1965, 2000, pp. 238-251.
Monteiro et al., "Resistance against power analysis attacks on adiabatic dynamic and adiabatic differential logics for smart card," in Proc. ISPACS, Dec. 2011, pp. 1-5.
Moon et al., "An efficient charge recovery logic circuit," IEEE J. Solid State Circuits, vol. 31, No. 4, pp. 514-522, 1996.
Morrison et al., "Synthesis of dual rail adiabatic logic for low power security applications," IEEE Trans. Comput. Aided Design, vol. 33, No. 7, pp. 975-988, Jul. 2014.
Morrison et al., Design of Adiabatic Dynamic Differential Logic for DPA-Resistant Secure Integrated Circuits, IEEE Transactions on Very Large Scale Integration (VLSI) Systems, vol. 23, No. 8, Aug. 2015, pp. 1381-1389.
Nakata et al., "Increase in read noise margin of single-bit-line SRAM using adiabatic change of word line voltage," IEEE Trans. Very Large Scale Integr. (VLSI) Syst., vol. 22, No. 3, pp. 686-690, Mar. 2014.
Orlov et al., "Experimental test of Landauer's principle at the sub-k B T level," Jpn. J. Appl. Phys., vol. 51, No. 6S, p. 06FE10, Jun. 2012.
Paul et al., "Low power BDD—based synthesis using dual rail static DCVSPG logic," in Proc. APCCAS, Dec. 2006, pp. 1504-1507.
Pramstaller et al., "Towards an AES crypto-chip resistant to differential power analysis," in Proc. ESSCIRC, Sep. 2004, pp. 307-310.
Rammohan et al., Reduced Complementary Dynamic and Differential Logic: A CMOS Logic Style for DPA-resistant Secure IC Design. 2008, IEEE Computer Society, pp. 699-705.
Seitz et al., "Hot-clock nMOS," in Proc. Chapel Hill Conf. VLSI, 1985, pp. 1-19.
Snider et al., "Minimum energy for computation, theory vs. experiment," in Proc. 11th IEEE-NANO, Aug. 2011, pp. 478-481.
Sundaresan et al., "Power invariant secure-IC design methodology using reduced complementary dynamic and differential logic," in Proc. IFIP Int. Conf. Very Large Scale Integr. (VLSI-SoC), Oct. 2007, pp. 1-6.
Tiri et al., A Logic Level Design Methodology for a Secure DPA Resistant ASIC or FPGA Implementation. UCLA Electrical Engineering Department, IEEE Computer Society, 2004, pp. 1-6.
Tschanz et al., "Adaptive body bias for reducing impacts of die-to-die and within-die parameter variations on microprocessor frequency and leakage," IEEE J. Solid-State Circuits, vol. 37, No. 11, pp. 1396-1402, Nov. 2002.
Van Rentergem et al., "Optimal design of a reversible full adder," Int. J. Unconv. Comput., vol. 1, No. 4, p. 339, 2005.
Yang et al., "A novel fast low voltage dynamic threshold true single phase clocking adiabatic circuit," in Proc. ISCAS, vol. 2. May 2004, pp. 289-292.
Ye et al., "Energy recovery circuits using reversible and partially reversible logic," IEEE Trans. Circuits Syst. I, Fund. Theory Appl. vol. 43, No. 9, pp. 769-778, Sep. 1996.
Younis, "Asymptotically zero energy computing using split-level charge recovery logic," M.S. thesis, Dept. Electr. Eng. Comput. Sci., MIT, Cambridge, MA, USA, 1994, pp. 1-114.
Toffoli, "Reversible computing," Lab. Comput. Sci., Massachusetts Inst. Technol., Cambridge, MA, USA, Tech. Rep. TM-151, 1980, pp. 1-37.

(56) References Cited

OTHER PUBLICATIONS

Landauer, "Irreversibility and heat generation in the computing process," IBM J.Res. Develop., vol. 5, No. 3, pp. 183-191, Jul. 1961.

Daemen et al., "Resistance against implementation attacks: A comparative study of the AES proposals," in Proc. 2nd Adv. Encryp-tion Standard (AES) Candidate Conf., 1999, pp. 1-11.

Kioi et al., "Forward body-bias MOS (FBMOS) dual rail logic using an adiabatic charging technique with sub -0.6 V operation," Electron. Lett. vol. 33, No. 14, pp. 1200-1201, Jul. 1997.

Ramakrishnan, "SDMLp—Secure differential multiplexer logic: Logic design for DPA resistant cryptographic circuits," M.S. thesis, Dept. Comput. Eng., Univ. Cincinatti, Cincinnati, OH, USA, 2012, pp. 1-126.

Tiri et al., "A dynamic and differential CMOS logic with signal independent power consumption to withstand differential power analysis on smart cards," in Proc. ESSCIRC, Sep. 2002, pp. 403-406.

PTM 22 nm HSPICE Model. [Online]. Available: http://ptm.asu.edu/modelcard/HP/22nm_HP.pm, accessed Feb. 24, 2016.

Hokazono et al., "MOSFET design for forward body biasing scheme," IEEE Electron Device Lett., vol. 27, No. 5, pp. 387-389, May 2006.

* cited by examiner

ADIABATIC DYNAMIC DIFFERENTIAL LOGIC FOR DIFFERENTIAL POWER ANALYSIS RESISTANT SECURE INTEGRATED CIRCUITS

CROSS-REFERENCE TO RELATED APPLICATIONS

This invention claims priority to U.S. Provisional Patent Application No. 62/085,941 filed Dec. 1, 2014 entitled "Adiabatic Dynamic Differential Logic for Differential Power Analysis Resistant Secure Integrated Circuits", the content of which is incorporated herein by reference.

BACKGROUND OF THE INVENTION

Smart cards are small integrated circuits (ICs) embedded onto plastic or tokens and are used for authentication, identification and personal data storage. Smart cards are used by the military, in automatic teller machines, in mobile phone subscriber identity module cards, by schools for tracking class attendance and for storing certificates for use in secure web browsing. They are also used internationally as alternatives to credit and debits cards by many of the major credit card companies. Smart cards are application specific, in order to minimize their size and software overhead. In addition, smart cards use tamper-resistant, secure file cryptosystems, making them more difficult to forge than tokens, money, and government-issued identification cards. They can be programmed to deter theft by preventing immediate reuse, making them more effective than cards with magnetic strips. Due to their emphasis on security at both the software and hardware levels, smart card technology is emerging as the platform of choice in key vertical markets. Smart-card technology is moving toward multiple applications, higher interoperability, and multiple interfaces, such as TCP/IP, near field communicators and contactless chips.

Due to their recent proliferation, smart cards are targets of attacks motivated by identity theft, fraud, and fare evasion. Despite their secure software design, smart cards may still be susceptible to side-channel attacks, which are based on correlations of leaked secondary information in combination with the integrated circuit (IC) output signals. In smart cards, sources of leaked secondary information include electromagnetic emanations (EM leakage), measurements of the amount of time required to perform private-key operations and analysis of noisy power consumption.

One of the most effective attacks on smart cards is a differential power analysis (DPA) attack. In a DPA attack, the attacker analyzes the power consumption in the IC and compares it to the IC's output signals. The leaked side-channel information analyzed in a DPA attack is due to the presence of entropy gain in the system. DPA attacks are effective, since most modern computing technology is CMOS-based, and the power consumption tendencies of these devices are well studied. As such, reducing the power consumption of the CMOS circuit makes a DPA attack more difficult.

Accordingly, what is needed in the art is a cost-effective, improved system and method for reducing the effectiveness of DPA attacks on secure integrated chips, such as smart cards.

SUMMARY OF INVENTION

The present invention provides a system and method utilizing adiabatic dynamic differential logic (ADDL) for reducing the effectiveness of DPA attacks on CMOS-based secure integrated circuit devices.

In various embodiments, an adiabatic dynamic differential logic circuit is provided for mitigating a differential power analysis (DPA) attack on a secure integrated chip including a plurality of transistors configured to perform each of a plurality of two-input logical output calculations, wherein each of the two-input logical output calculations results in a minimal differential power of the logic circuit.

In one embodiment, a high-performance adiabatic dynamic differential logic circuit is provided which is optimized for very high operating frequencies. The system and method in accordance with this embodiment of the invention improves the differential power over previous dynamic and differential logic methods by up to 89.65%.

In another embodiment, a body-biased adiabatic dynamic differential logic circuit is provided which utilizes transistor body biasing to improve the switching time and differential power of the design. The system and method in accordance with this ultra low-power embodiment of the invention improves the differential power over previous dynamic and differential logic methods by a factor of 199.16.

Accordingly, the present invention provides a cost-effective system and method for reducing the effectiveness of DPA attacks on Secure Integrated Chip, such as smart cards.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Reducing the power consumption of an integrated circuit makes a differential power analysis (DPA) attack more difficult. Reversible logic is a promising design paradigm for the implementation of ultra-low power computing structures with minimal entropy gain because quantum mechanics principles govern the physical limitations of computing devices. These systems dissipate energy due to bit erasure within their interconnected primitive structures, which is an important consideration as transistor density increases. Adiabatic logic is an implementation of reversible logic in CMOS where the current flow through the circuit is controlled such that the energy dissipation due to switching and capacitor dissipation is minimized. The minimization of energy dissipation is accomplished by recycling circuit energy rather than dissipating it into the surrounding environment. This technique is beneficial for CMOS implementations, since the input and output charges are maintained separately.

Production of cost-effective secure integrated chips, such as smart cards, requires hardware designers to consider tradeoffs in size, security, and power consumption. In order to design successful security-centric designs, the low-level hardware must contain built-in protection mechanisms to supplement cryptographic algorithms such as Advanced Encryption Standard (AES) and Triple Data Encryption Standard (DES) by preventing side channel attacks, such as Differential Power Analysis (DPA). Dynamic logic obfuscates the output waveforms and the circuit operation, reducing the effectiveness of the DPA attack. While it is known in the art that dynamic logic obfuscates the output waveforms and the circuit operation, thereby reducing the effectiveness of the DPA attack, previous methods rely on conventional, lossy logic methods for obtaining the required dynamic logical outputs.

Smart cards consist of a secure integrated chip, which contains the main processor, arithmetic logic unit, processing registers, random access memory for arithmetic processing, read-only memory (ROM) for storing the operating system, and electrically erasable programmable ROM for data memory. The operating system controls data access and implements the cryptographic security algorithms. The international standard for contact-based smart cards electronic identification cards is the ISO/IEC 7816, and the contactless smart card is the ISO/IEC 14443. In this standard, smart cards use the triple data encryption standard (DES), and the standard operating frequency is 13.56 MHz.

Since the design of smart cards has been standardized, and their development is moving from single issuer models to cooperative private-public sector partnerships, a two-prong approach to smart card security is required: software systems security and hardware-oriented security. Even though smart cards utilize operating systems with cryptographic kernels, the memory devices used to store them are not isolated in perfectly tamper-proof locations. As a result, analysis of a chip's operation metrics, such as differential power consumption, total execution time, magnetic field values, and radio frequencies allows attackers to gain sensitive user data. The effectiveness of these side-channel attacks has been studied. It has been demonstrated that attackers may be able to find fixed Diffe-Hellman exponents, factor Rivest-Shamir-Adleman (RSA) keys, and break other cryptosystem by analyzing power consumption and private key execution time.

The use of power consumption to obtain compromising information is known as a differential power analysis (DPA) attack. The attacker analyzes information gleaned from the practical implementation details of otherwise secure algorithms. Most modern computing systems use CMOS technology, and the dynamic power consumption of a CMOS gate is proportional to its input signals. Therefore, analyzing the output power consumption allows the attacker to determine a correlation between the data and the key, since the switching in the CMOS gates is dependent on those inputs.

The primary drawback with addressing DPA attacks at the software level is that the power and current variations being analyzed by the attacker occur at the hardware level and no software algorithm, however effective, can affect the operation of a CMOS gate once it receives an input signal. For example, inserting random process interrupts to prevent sequential operation of an algorithm may be circumvented by resynchronization and integration techniques. In addition, bit masking can be defeated using DPA attacks.

Therefore, the most effective approach for the prevention of DPA attacks is to include security-based logic within the hardware implementation itself to make it difficult for the attacker to ascertain the necessary information to determine the inputs. The three most important metrics to consider when designing CMOS circuits for this purpose are power consumption, area, and operating frequency, since the energy dissipated is equal to $E_{diss}=C_L*V_{dd}^2*f$, where $C_L$ is the load capacitance, $V_{dd}$ the supply voltage, and f is the operating frequency.

The adiabatic theorem states that a physical system remains in its instantaneous eigenstate if a given perturbation is acting on it slowly enough and if there is a gap between the eigenvalue and the rest of the Hamiltonian's spectrum. Since CMOS circuits operate on clock cycles, adiabatic logic design results in a gauge-invariant Berry phase. Normally, when waves are subjected to variations that are self-retracting, then the initial and final states of the system will differ. To prevent this, adiabatic systems are designed reversibly so that the system may always reach its initial state, regardless of the number of cycles it operates. Therefore, the objective of adiabatic logic design is to use the principles of reversible logic to minimize energy dissipation in CMOS circuits.

There are two issues that must be addressed in any adiabatic circuit. First, the implementation must result in an energy-efficient design of the combined power supply and clock generator. Second, reversible logic functions require greater logical overhead to meet the bijective requirement. Therefore, the energy dissipated by switching of the circuit must be controlled and recycled instead of dissipated into the environment.

In accordance with one embodiment of the present invention, a method for implementation of a high-performance adiabatic dynamic differential logic (ADDL) design methodology for mitigating DPA attacks in high-performance applications is provided. The data presented for this embodiment was obtained using HPSICE simulations using the 22-nm predictive technology model.

The objective of the high-performance ADDL is to design a universal cell capable of dynamically performing all of the fundamental two-input logical calculations (AND, NAND, OR, NOR, XOR, and XOR) with the minimal differential power for each logical calculation. The device is both logically and physically bijective. This means that the input waveform may be uniquely determined by reading the output waveforms, a necessity in implementation of low-power reversible and adiabatic designs.

The logical calculation of the output signals of the high-performance ADDL are $P=A'$, $P'=A$, $Q=\overline{(A+B)\oplus C}$, $Q'=(A+B)\oplus C$, $R=A\overline{B}\oplus C$, and $R'=AB\oplus C$. The truth table of the device is shown in TABLE I, and the logic outputs of the high-performance ADDL are presented in TABLE II.

TABLE I

TRUTH TABLE FOR PROPOSED HIGH-PERFORMANCE ADDL CELL

| A | A' | B | B' | C | C' | P | P' | Q | Q' | R | R' |
|---|----|---|----|---|----|---|----|---|----|---|----|
| 0 | 1 | 0 | 1 | 0 | 1 | 1 | 0 | 1 | 0 | 1 | 0 |
| 0 | 1 | 0 | 1 | 1 | 0 | 1 | 0 | 0 | 1 | 0 | 1 |
| 0 | 1 | 1 | 0 | 0 | 1 | 1 | 0 | 0 | 1 | 1 | 0 |
| 0 | 1 | 1 | 0 | 1 | 0 | 1 | 0 | 1 | 0 | 0 | 1 |
| 1 | 0 | 0 | 1 | 0 | 1 | 0 | 1 | 0 | 1 | 1 | 0 |
| 1 | 0 | 0 | 1 | 1 | 0 | 0 | 1 | 1 | 0 | 0 | 1 |
| 1 | 0 | 1 | 0 | 0 | 1 | 0 | 1 | 0 | 1 | 0 | 1 |
| 1 | 0 | 1 | 0 | 1 | 0 | 0 | 1 | 1 | 0 | 1 | 0 |

TABLE II

HIGH-PERFORMANCE ADDL CELL LOGIC OUTPUTS

| Control Signal | P | P' | Q | Q' | R | R' |
|---|---|---|---|---|---|---|
| A = 0 | A' | A | $\overline{B \oplus C}$ | $B \oplus C$ | C' | C |
| A = 1 | A' | A | C' | C | $\overline{B \oplus C}$ | $B \oplus C$ |
| B = 0 | A' | A | $\overline{A \oplus C}$ | $A \oplus C$ | C' | C |
| B = 1 | A' | A | C' | C | $\overline{B \oplus C}$ | $B \oplus C$ |
| C = 0 | A' | A | $\overline{A+B}$ | $A+B$ | $\overline{AB}$ | $AB$ |
| C = 1 | A' | A | $A+B$ | $\overline{A+B}$ | $AB$ | $\overline{AB}$ |

Figure 1A:
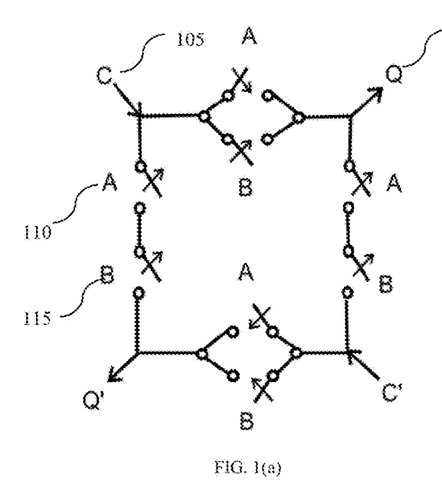
FIG. 1(a) is a diagrammatic illustration of a basic square circuit diagram for the proposed high-performance adiabatic dynamic differential logic (ADDL) cell illustrating logical calculations for the Q and Q' which are based on the A, B and C inputs, in accordance with an embodiment of the present invention.
Figure 1B:
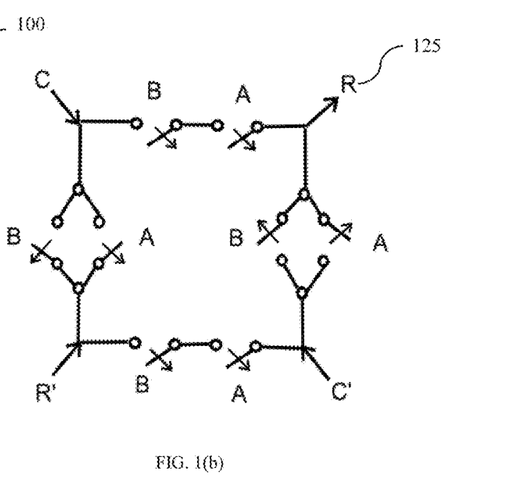
FIG. 1(b) is a diagrammatic illustration of a basic square circuit diagram for the proposed high-performance ADDL cell, illustrating the logical calculations for the R and R', in accordance with an embodiment of the present invention.

FIG. 1(a) and FIG. 1(b) illustrate the design process of the high-performance ADDL cell. The objective of the basic square circuit diagram is to determine the switches required for an input signal to flow from an input to an output. Consider FIG. 1(a): in order for the output Q 100 to be 1 when input C 105 is a 1, either A 110 or B 115 must be a 1, which would close the switch. The circuit diagram shows whether the switch will open or closes when the appropriate input signal is a 1. The output Q 100 is determined in FIG. 1(a) and the output R 125 is determined in FIG. 1(b).

Figure 2:
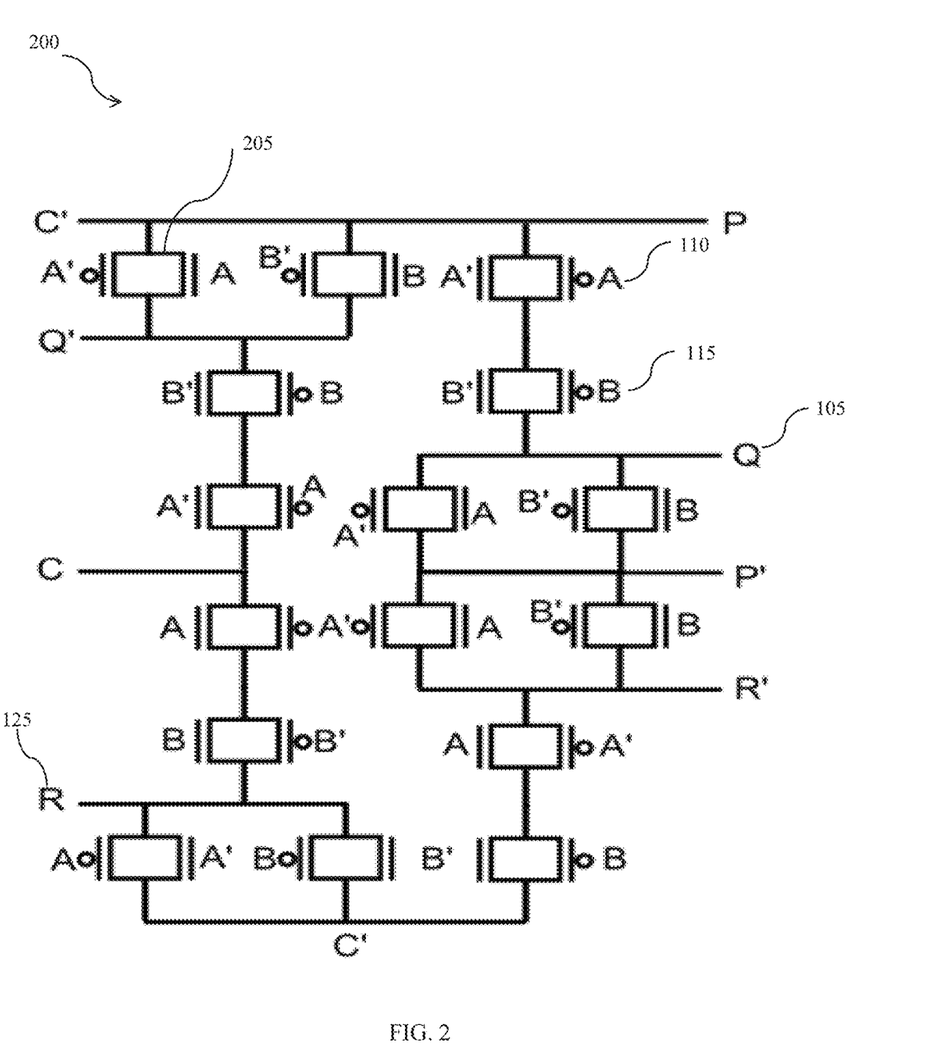
FIG. 2 is a CMOS schematic diagram of a proposed high-performance ADDL cell, in accordance with an embodiment of the present invention.

FIG. 2 shows the gate level design 200 of the high-performance ADDL cell derived from the basic square circuit diagram in FIG. 1(a) and FIG. 1b). In this embodiment, the device has 32 transistors, configured as nMOS and pMOS pairs 205, wherein each transistor has their gate, drain and source tied to an input or an output signal of the logic circuit. In this embodiment, the pMOS transistors are biased to the nominal supply voltage, which is 0.8 V in a 22-nm model, and the nMOS transistors are biased to ground. The advantage of this approach is that evaluation and discharge signals are not required, which means that the circuit consumes less power, even though the device itself includes more transistors.

The arrows in the basic square diagrams of FIG. 1(a) and FIG. 2(b) indicate what will occur if the signal shown is a logic 1. For example, in FIG. 1(a), if A 110 is a logic 1, then there exists a path from C 105 to Q 100, meaning that the logical values of C 105 and Q 100 will be equivalent. This is because the pMOS/nMOS pair will have the nMOS with 1 and the pMOS with 0, and the path will be activated. In FIG. 1(b), the path from C 105 to R 125 will be switched OFF if A 110 or B 115 is 1. This is because the pMOS/nMOS pair will have the nMOS with 0 and the pMOS with 1. Therefore, to have C 105 equal to R 125, then A 110 must be 0, and B 115 mist be 0.

Figure 3:
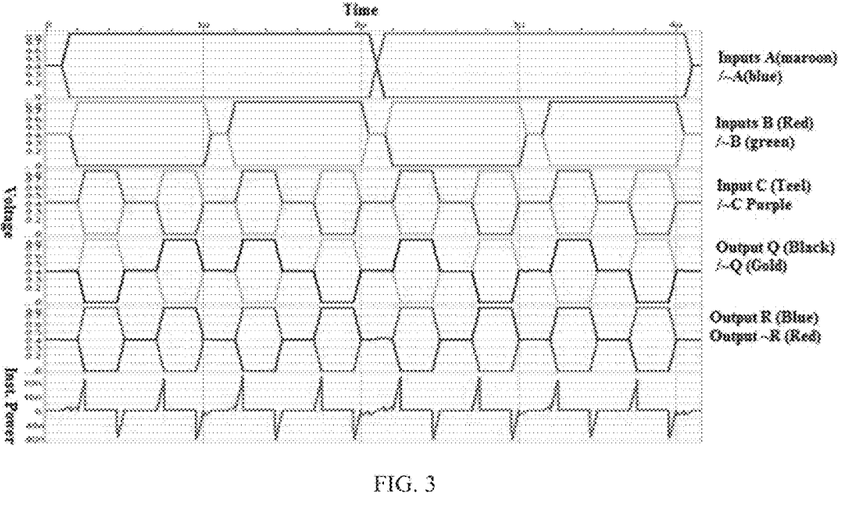
FIG. 3 is graph illustrating a simulation waveform of the high-performance ADDL cell at 1 MHz, in accordance with an embodiment of the present invention.

The simulation waveform of the high-performance ADDL cell is shown in FIG. 3. As illustrated in FIG. 3, the average power of the high-performance ADDL device at 1 MHz is $6.3459*10^{-10}$ W. Therefore, the device consumes $6.3459*10^{-16}$ J of energy every computing cycle. The instantaneous power dissipation is similar for every switching event, regardless of the input and output signals. The highest switching peak power of the device is $9.6867*10^{-8}$ W, and the smallest switching peak power is $8.6750*10^{-8}$ W, giving a differential power of $1.0117*10^{-8}$ W. In FIG. 3, the first, second, and third waveforms show the A and A', B and B', and C and C' waveforms, respectively. The fourth waveform represents the Q and Q' output signals. The fifth waveform represents the R and R' output signals. The bottom waveform is the instantaneous power.

Figure 4:
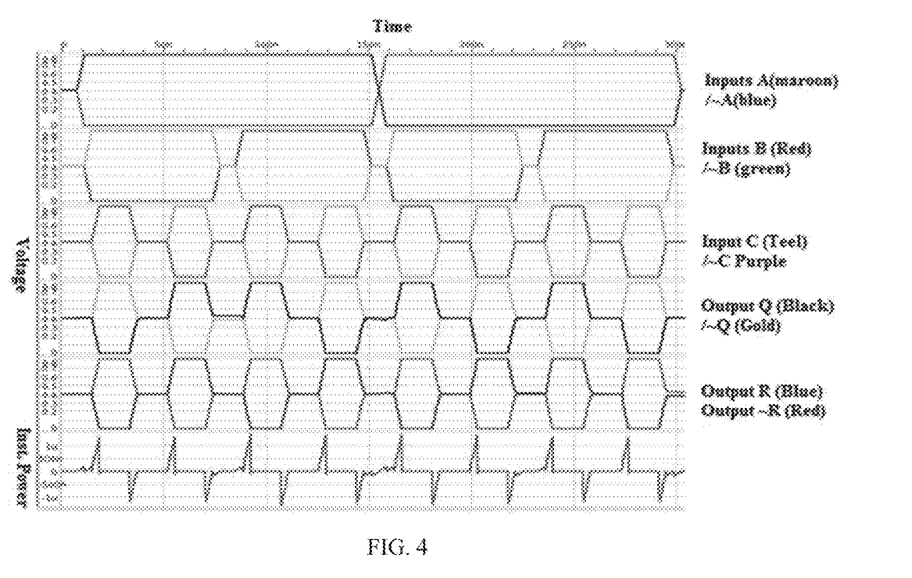
FIG. 4 is a graph illustrating a simulation waveform of the high-performance ADDL cell at 13.56 MHz in accordance with an embodiment of the present invention.

The operation of the exemplary high-performance ADDL cell at 13.56 MHz is shown with reference to FIG. 4. In this embodiment, the operating frequency of 13.56 MHz is chosen since it is the standard operating frequency of smart cards using the ISO/IEC 14443. The average power of the high-performance ADDL device at 13.56 MHz is $8.5963*10^{-9}$ W, therefore it consumes $6.3394*10^{-16}$ J of energy every computing cycle. The highest switching peak power of the device is $1.4430*10^{-6}$ W, and the smallest switching peak power is $1.3274*10^{-6}$ W, giving a differential power of $1.156*10^{-7}$ W. The average power of the NAND gate is $2.6382*10^{-8}$ W, giving the high-performance ADDL cell an improvement of 67.42%. The largest switching peak power of the NAND gate at 13.56 MHz is $8.9768*10^{-6}$ W, and the smallest peak is $1.0433*10^{-6}$ W, giving a differential power of $7.8355*10^{-6}$ W. Therefore, the high-performance ADDL cell improves upon the differential power by a factor of 67.78. The first, second, and third waveforms show the A and A', B and B', and C and C' waveforms, respectively. The fourth waveform represents the Q and Q' output signals. The fifth waveform represents the R and R' output signals. The bottom waveform is the instantaneous power.

The inventive high-performance ADDL method is compared with previous benchmarks for mitigation of DPA attacks, including SDMLp, ring-controlled delay, counter-controlled delay logic (RCCDL) and wave differential dynamic logic (WDDL), by reproducing those circuits in 22-nm technology using methods known in the art. The average power consumption of each of these methods, as well as the conventional implementation in CMOS, are compared to the high-performance adiabatic dynamic differential logic (PADDL) cell of the present invention as shown in TABLE III.

TABLE III

AVERAGE POWER CONSUMPTION ($10^{-8}$) AT 13.56 MHz

| Logic | CMOS | WDDL | RCDDL | SDMLp | PADDL |
|---|---|---|---|---|---|
|  | 2.9182 | 6.9751 | 1.99717 | 3.705 | 0.8596 |
|  | 2.6382 | 6.4056 | 11.01763 | 3.705 | 0.8596 |
| OR | 2.8106 | 7.2350 | 12.4442 | 3.718 | 0.8596 |
| NOR | 3.0702 | 7.0847 | 12.18568 | 3.718 | 0.8596 |
| XOR | 3.3451 | 11.0587 | 19.02096 | 3.508 | 0.8587 |
| XNOR | 3.3451 | 11.0587 | 19.02096 | 3.508 | 0.8587 |
| Avg | 3.0212 | 8.3029 | 14.2811 | 3.643 | 0.8593 |
| Std. Dev. | 0.2626 | 1.9653 | 3.380437 | 0.0961 | 0.0004 |
| Transistors Required for | 26 | 42 | 32 | 16 | 7.1 |

TABLE III-continued

AVERAGE POWER CONSUMPTION ($10^{-8}$) AT 13.56 MHz

| Logic | CMOS | WDDL | RCDDL | SDMLp | PADDL |
|---|---|---|---|---|---|
| Universal Cell Area ($nm^2$) | 505752 | 816983 | 622462 | 341622 | 532022 |

The results of TABLE III show that the high-performance ADDL design of the present invention is advantageous over the previous designs in average power for each of the fundamental calculations AND, NAND, OR, NOR, XOR, and XNOR. The high-performance ADDL design of the present invention improves upon SDMLp by 76.41%, over RCCDL by 93.98% and over WDDL by 89.65%. The implementation of SDMLp is the previously best implementation, since it uses evaluate and discharge phases. Locally, SDMLp is advantageous in terms of required transistors, since implementation of SDMLp requires 16 transistors as opposed to the 32 transistors needed in the high-performance adiabatic dynamic differential logic implementation of the present invention. However, this advantage is erased when cascading the cells together. The hardware overhead required in SDMLp to ensure proper timing of evaluation and discharge stages of each cell increases exponentially as the length of the critical path of the device increases. The high-performance ADDL circuit of the present invention does not require any overhead for maintaining evaluation and discharge phases, making it the better cell for larger implementations, such as DES circuits.

In TABLE IV, the results of the average energy dissipation during the state transitions of the high-performance ADDL, compared with the previously presented work, are presented. In this embodiment, the frequency is 13.56 MHz and the rise and fall times of the state transitions are $1.8436*10^{-8}$ s.

TABLE IV

ENERGY DISSIPATION ($10^{-16}$ J) DURING STATE TRANSITIONS AT 13.56 MHZ

| Logic | CMOS | WDDL | RCDDL | SDMLp | PADDL |
|---|---|---|---|---|---|
| AND | 12.4899 | 31.23845 | 46.06913 | 13.7826 | 3.197712 |
| NAND | 11.2915 | 28.69709 | 42.3077 | 13.7826 | 3.197712 |
| OR | 12.02937 | 23.4128 | 47.78573 | 13.83096 | 3.197712 |
| NOR | 13.14046 | 31.73946 | 46.79301 | 13.83096 | 3.197712 |
| XOR | 14.31073 | 49.54298 | 73.04049 | 13.04976 | 3.194364 |
| XNOR | 14.31703 | 49.54298 | 73.04049 | 13.04976 | 3.194364 |
| Avg | 12.93088 | 37.19729 | 54.84942 | 13.55444 | 3.196596 |
| Std. Dev. | 1.231382 | 9.645241 | 14.21984 | 0.391521 | 0.001729 |

Figure 5:
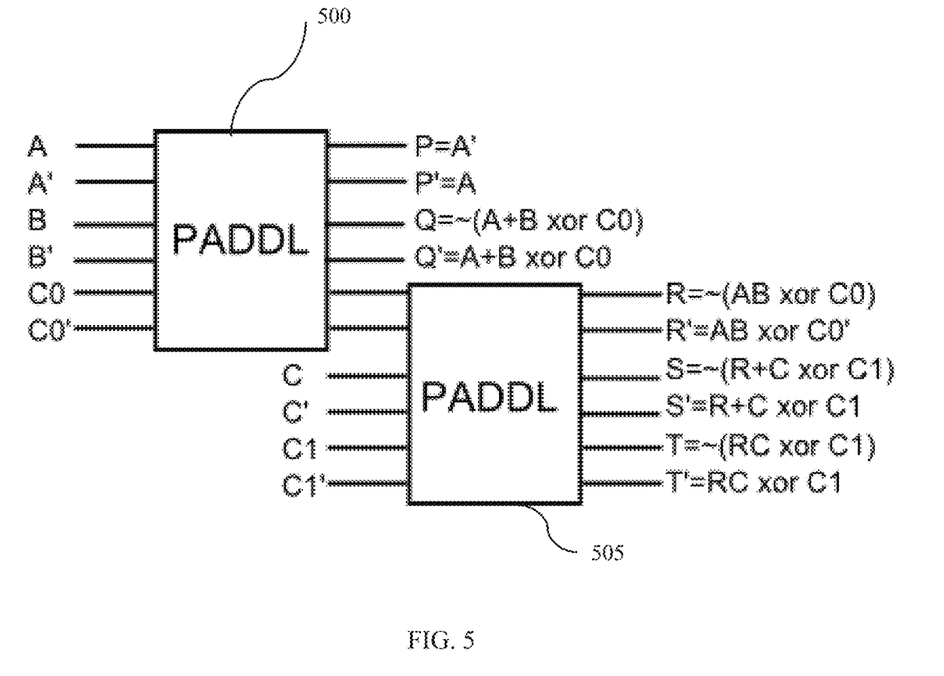
FIG. 5 is a diagrammatic illustration of cascaded high-performance ADDL cells with logic outputs shown, in accordance with an embodiment of the present invention.

The objective of the high-performance ADDL design of the present invention is to disassociate the instantaneous power waveform from the output signals of the circuit to make it more difficult to determine the functionality of the circuit by reading the instantaneous power waveform and the output signals. It should be noted that the high-performance ADDL cell is bijective, so the input signals may be uniquely determined by studying the output signals. As such, the functionality of the cell can be easily determined by studying the output signals. This circuit is a 3*3 dual-rail device, so the function may easily be determined by reading $2^3$ input signals. However, since the high-performance ADDL cell is universal it may be combined with other high-performance ADDL cells to generate larger circuits, complicating the effectiveness of this strategy. For example, a three-input NAND gate would require seven inputs, since it requires two cascaded high-performance ADDL cells 500, 505, as shown in FIG. 5. Therefore, instead of only needing to read eight outputs, an attacker would have to consider 512 inputs to properly ascertain the circuit's functionality. Furthermore, the triple DES uses a cipher key size of 56 b, meaning that an attacker would have to analyze $7.2057*10^{16}$ output signals to properly reverse engineer the circuit.

In addition, the high-performance ADDL cell does not require additional evaluation and discharge signals to generate the results further in the cascade. Every cell in the other methods currently known in the prior art, require a unique evaluation and discharge signal. This means that the overhead required to manage the input and output signals using the high-performance ADDL circuit of the present invention is significantly reduced. This is beneficial, since DPA mitigation methods have difficulty propagating the signal through the circuit due to signal degradation. The high-performance ADDL approach of the present invention uses the existing signals for evaluation and discharge, which is advantageous over WDDL, RCCDL, and SDMLp. Therefore, even though the transistor count is higher in the high-performance ADDL cell of the present invention, the added power required to generate the evaluation and discharge signals in the other methods known in the art results in an easier DPA attack.

Improving the area of the high-performance ADDL device of the present invention is also important. In an additional embodiment of the present invention, the issue of area improvement is addressed through the use of body biasing in subthreshold operation of the adiabatic dynamic differential logic (ADDL). In this embodiment, a method for implementation of ADDL at subthreshold operation for ultralow power implementation is presented. To accomplish the ultra low-power ADDL implementation, a forward body-biased ADDL method is designed to reduce the average power consumption and differential power consumption of the circuit and to enable the use of shorter gates. This method in accordance with this embodiment is referred to as body-biased ADDL. The design of body-biased ADDL is essentially the same as the high-performance ADDL design shown in FIG. 1(a) and FIG. 1(b). The difference is that the nominal voltage is 0.5 V, which is below the threshold voltage of the transistors. For the body-biased ADDL, simulation results were performed at 13.56 MHz, the standard operating frequency of the ISO/IEC 14443 smart card.

Figure 6:
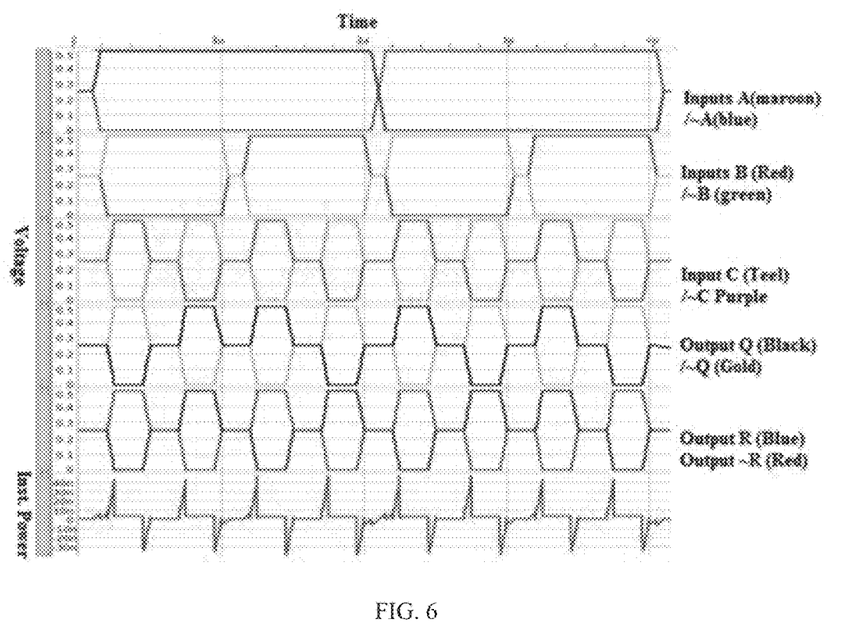
FIG. 6 is a graph illustrating a simulation waveform of the body-biased ADDL logic cell operation at 13.56 MHz, in accordance with an embodiment of the present invention.

FIG. 6 illustrates the operation of the body-biased ADDL device in accordance with an exemplary embodiment of the present invention, operating at 13.56 MHz. As shown, the average power of the body-biased ADDL device at 13.56 MHz is $9.6093*10^{-10}$ W, which means that the circuit consumes $6.3394*10^{-16}$ J of energy every computing cycle. This is an 88.82% improvement over the high-performance ADDL and a 97.4% improvement over the prior art SDMLp method. The highest switching peak power of the body-biased ADDL device is $4.4800*10^{-8}$ W, and the smallest switching peak power is $3.9069*10^{-8}$ W, giving a differential power of $5.7305*10^{-9}$ W. As such, the body-biased ADDL design gains an improvement of 56.64% over the high-performance ADDL. Therefore, the body-biased ADDL cell improves upon the differential power of the conventional NAND gate by a factor of 199.16.

Figure 7:
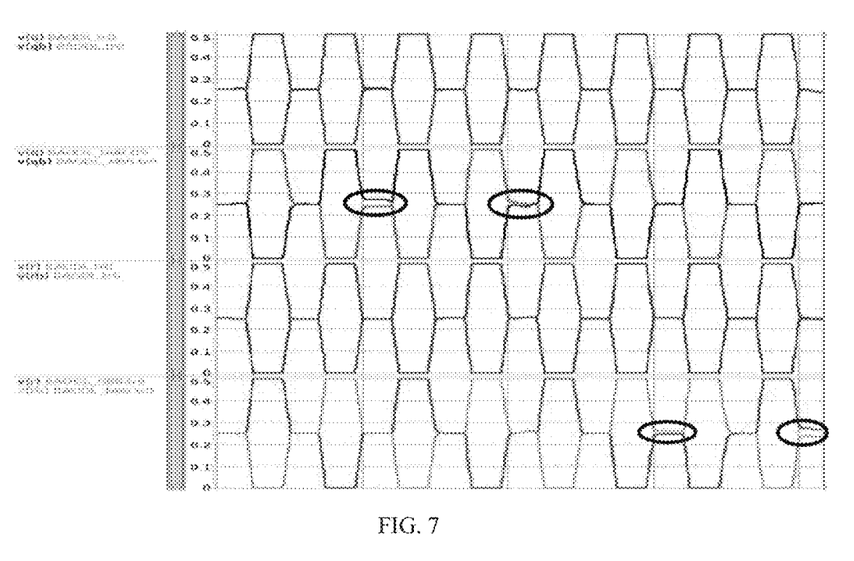
FIG. 7 is a graph illustrating a comparison of body-biased ADDL logic cell operation, with and without body bias at 13.45 MHz, in accordance with an embodiment of the present invention.

FIG. 7 illustrates the improvement in operation of the ADDL output signals using body biasing. The top waveform in FIG. 7 shows the Q and Q* outputs for the body-biased ADDL with a body bias of 0.25 V. The second waveform shows these outputs in a high-performance ADDL implementation at 0.5 V. As illustrated, the outputs for input combinations {001} and {011} are degraded for the non-body-biased implementation, whereas they are not degraded for the body-biased ADDL. The third and fourth waveforms represent the R and R outputs for the high-performance ADDL and the body-biased ADDL circuits, respectively. As shown, the outputs for input combinations {101} and {111} are degraded for the non-body-biased implementation, whereas they are not degraded for the body-biased ADDL.

In the present low power implementation, since the nMOS transistor is body-biased, it is possible to reduce the gate width to 300 nm. In addition the transistor length can be reduced for both the pMOS and nMOS transistors from 50 to 30 nm, which is the minimum transistor length permitted by the model.

The tradeoff in designs for the high-performance ADDL and body-biased ADDL is performance versus low power. The body-biased ADDL design successfully simulates at 13.65 MHz, sufficient for the ISO/IEC 14443 standard. However, the signal quickly begins to degrade after 20 MHz due to the low-supply voltage. The high-performance ADDL effectively simulates in frequencies in excess of 100 MHz. As shown in FIG. 6, the first, second, and third waveforms show the A and A', B and B', and C and C' waveforms, respectively. The fourth waveform represents the Q and Q' output signals. The fifth waveform represents the R and R' output signals. The bottom waveform is the instantaneous power.

In FIG. 7, the top waveform shows the Q and Q' signals for the cell with body biasing. The second waveform shows the Q and Q signals without body biasing. Comparing these two waveforms shows how the signal degrades at subthreshold operation without the body biasing. The Q and Q' signals for the non-body-biased implementation degrade when B and C both equal one. These instances are shown circled in FIG. 7. The third waveform shows the R and R' signals for the cell with body-biasing. The fourth waveform shows the R and R' signals without body-biasing. Comparing these two waveforms shows how the signal degrades at subthreshold operation without body biasing. The R and R' signals for the non-body-biased implementation degrade when B and C both equal one. These instances are shown circled in FIG. 7.

Figure 8:
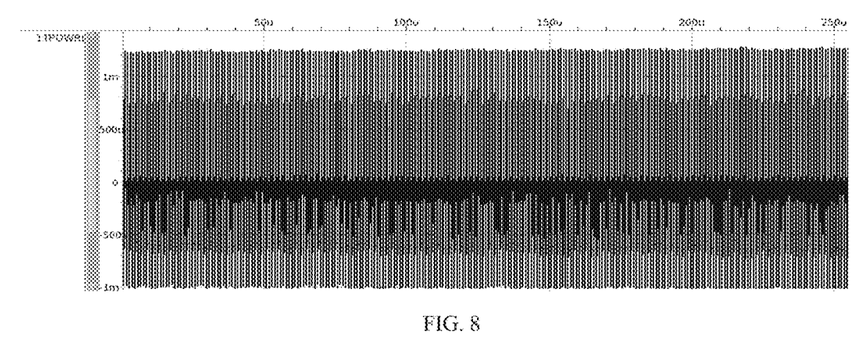
FIG. 8 is a graph illustrating a power waveform for all 256 inputs at 13.56 MHz and 22 nm, in accordance with an embodiment of the present invention.

The present invention can be implemented in a Rijndael S-Box architecture in which the S-box is generated by determining the multiplicative inverse for a given number in Rijndael's Galois field and the multiplicative inverse is then transformed using an affine transformation matrix, A synthesis algorithm for implementation of dual-rail adiabatic logic in security circuits is known in the art, in which it is demonstrated that such a design method is advantageous in low-power synthesis. In accordance with the present invention, the instantaneous waveform for the 256 inputs required for Rijndael S-Box implementation is shown in FIG. 8. The power waveform for 16 random inputs is shown in FIG. 9.

Figure 9:
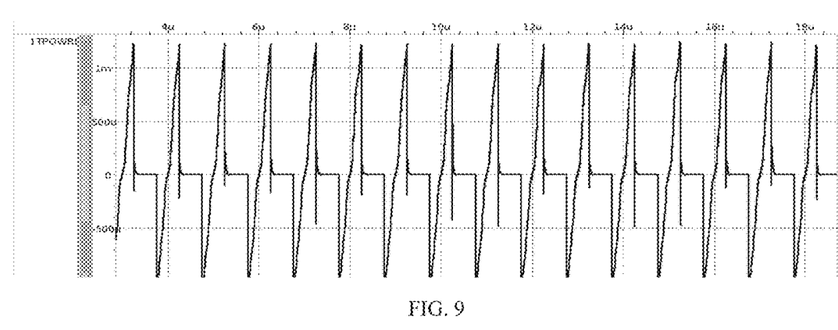
FIG. 9 is a graph illustrating a power waveform for 16 random inputs at 13.56 MHz and 22 nm, in accordance with an embodiment of the present invention.

The illustrations in FIG. 8 and FIG. 9 show the scalability of the proposed method from the high-performance ADDL cell at 32 transistors to the S-Box architecture at 9612 transistors. In this embodiment, the cell area is 47.62 $\mu m^2$, the average power consumption is 2.78 µW, and the worst-case energy imbalance, which is the metric used by DPA attackers, is 3.3%.

The present invention provides an ADDL design methodology for mitigation of DPA attacks on secure integrated chips. To consider the tradeoff in performance and power consumption, two universal cells have been presented and simulated. The first embodiment of the present invention is a high-performance ADDL, which is optimized for very high operating frequencies. This design improves upon previously presented benchmarks by 76.41% for average power due to a reduced reliance on evaluation and discharge networks. The high-performance ADDL cell also improved upon the differential power of a conventional NAND gate by a factor of 112. The second embodiment of the present invention is a body-biased ADDL, which uses body biasing to improve the switching time and differential power.

The present invention may be embodied on various computing platforms that perform actions responsive to software-based instructions to configure the transistors to provide the desired high-performance ADDL or body-biased ADDL. The following provides an antecedent basis for the information technology that may be utilized to enable the invention.

The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. However, as indicated above, due to circuit statutory subject matter restrictions, claims to this invention as a software product are those embodied in a non-transitory software medium such as a computer hard drive, flash-RAM, optical disk or the like.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object oriented programming language such as Java, C#, C++, Visual Basic or the like and conventional procedural programming languages, such as the "C" programming language or similar programming languages.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in description of the invention.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A logic circuit for mitigating a differential power analysis (DPA) attack on a secure integrated chip, the logic circuit comprising:
 a plurality of transistors configured to perform each of a plurality of two-input logical output calculations, wherein each of the two-input logical output calculations results in a minimal differential power of the logic circuit; and
 wherein A, B and C are control signals and wherein the two-input logical output calculations of the logic circuit include:

$P=A'$, $P'=A$, $Q=\overline{(A+B)}\oplus C$, $Q'=(A+B)\oplus C$, $R=\overline{AB}\oplus C$
 and $R'=AB\oplus C$.

2. The logic circuit of claim 1, wherein the plurality of two-input logical output calculations include AND, NAND, OR, NOR, XOR, and XOR.

3. The logic circuit of claim 1, wherein each of the plurality of transistors has a gate node, a drain node and a source node coupled to an input node or to an output node of the logic circuit.

4. The logic circuit of claim 1, wherein the logic circuit is physically bijective.

5. The logic circuit of claim 1, wherein the logic circuit is logically bijective.

6. The logic circuit of claim 1, wherein the plurality of transistors are CMOS transistors.

7. The logic circuit of claim 1, wherein the plurality of transistors further comprise a plurality of complimentary NMOS and PMOS transistors.

8. The logic circuit of claim 1, wherein each of the plurality of transistors has a nominal threshold voltage of approximately 0.8V.

9. The logic circuit of claim 1, wherein each of the plurality of transistors has a nominal threshold voltage of approximately 0.5V.

10. The logic circuit of claim 1, wherein the secure integrated chip comprises at least one cryptographic algorithm.

11. The logic circuit of claim 1, wherein the secure integrated chip is integrated into a smart card.

12. A secure integrated chip comprising:
 a logic circuit for mitigating a differential power analysis (DPA) attack on a secure integrated chips, the logic circuit comprising;
 a plurality of transistors configured to perform each of a plurality of two-input logical output calculations, wherein each of the two-input logical output calculations results in a minimal differential power of the logic circuit;
 wherein A, B and C are control signals and wherein the two-input logical output calculations of the logic circuit include:

$P=A'$, $P'=A$, $Q=\overline{(A+B)}\oplus C$, $Q'=(A+B)\oplus C$, $R=\overline{AB}\oplus C$
 and $R'=AB\oplus C$; and a memory module for storing at least one cryptographic algorithm.

13. The logic circuit of claim 12, wherein the plurality of two-input logical output calculations include AND, NAND, OR, NOR, XOR, and XOR.

14. The logic circuit of claim 12, wherein each of the plurality of transistors has a gate node, a drain node and a source node coupled to an input node or to an output node of the logic circuit.

15. The logic circuit of claim 12, wherein the plurality of transistors further comprise a plurality of complimentary NMOS and PMOS transistors.

16. The logic circuit of claim 12, wherein each of the plurality of transistors has a nominal threshold voltage of approximately 0.8V.

17. The logic circuit of claim 12, wherein each of the plurality of transistors has a nominal threshold voltage of approximately 0.5V.

18. The logic circuit of claim 12, wherein the logic circuit is logically bijective and physically bijective.

19. A method for mitigating a differential power analysis (DPA) attack on a secure integrated chip, the method comprising:
 configuring a plurality of transistors of a logic circuit on a secure integrated chip to have a gate node, a drain node and a source node of each of the plurality of transistors coupled to an input node or to an output node of the logic circuit; and
 performing, with the logic circuit, each of a plurality of two-input logical output calculations, wherein each of the two-input logical output calculations results in a minimal differential power of the logic circuit, wherein A, B and C are control signals and wherein the two-input logical output calculations of the logic circuit include:

$P=A'$, $P'=A$, $Q=\overline{(A+B)}\oplus C$, $Q'=(A+B)\oplus C$, $R=\overline{AB}\oplus C$
 and $R'=AB\oplus C$.

20. The method of claim 19, wherein the plurality of two-input logical output calculations include AND, NAND, OR, NOR, XOR, and XOR.

* * * * *